United States Patent
Kwon et al.

(10) Patent No.: US 11,152,561 B2
(45) Date of Patent: Oct. 19, 2021

(54) MAGNETIC MEMORY DEVICE

(71) Applicant: Samsung Electronics Co., Ltd., Suwon-si (KR)

(72) Inventors: Bae-Seong Kwon, Incheon (KR); Yongjae Kim, Seongnam-si (KR); Kyungtae Nam, Suwon-si (KR); Kuhoon Chung, Seoul (KR)

(73) Assignee: Samsung Electronics Co., Ltd.

( * ) Notice: Subject to any disclaimer, the term of this patent is extended or adjusted under 35 U.S.C. 154(b) by 21 days.

(21) Appl. No.: 16/867,138

(22) Filed: May 5, 2020

(65) Prior Publication Data
US 2020/0395531 A1    Dec. 17, 2020

(30) Foreign Application Priority Data
Jun. 11, 2019    (KR) .................. 10-2019-0068895

(51) Int. Cl.
*H01L 43/02*    (2006.01)
*H01L 43/12*    (2006.01)
*H01L 27/22*    (2006.01)

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 43/12; H01L 27/228
USPC ....................................................... 257/427
See application file for complete search history.

(56) References Cited

U.S. PATENT DOCUMENTS

| | | | |
|---|---|---|---|
| 7,894,246 B2 | 2/2011 | Ueda et al. | |
| 8,598,564 B2 | 12/2013 | Sakotsubo | |
| 8,907,435 B2 | 12/2014 | Lee et al. | |
| 8,975,088 B2 | 3/2015 | Satoh et al. | |
| 9,608,200 B2 | 3/2017 | Shen et al. | |
| 10,263,035 B2 * | 4/2019 | Ahn | ........................ H01L 43/10 |
| 2007/0215955 A1 | 9/2007 | Wu et al. | |
| 2011/0127626 A1 | 6/2011 | Li et al. | |
| 2013/0244345 A1 | 9/2013 | Li et al. | |
| 2016/0276580 A1 | 9/2016 | Tahmasebi et al. | |

FOREIGN PATENT DOCUMENTS

| | | |
|---|---|---|
| KR | 10-1501587 | 3/2015 |
| KR | 10-1534501 | 7/2015 |

* cited by examiner

*Primary Examiner* — Tu-Tu V Ho
(74) *Attorney, Agent, or Firm* — Myers Bigel, P.A.

(57) ABSTRACT

A magnetic memory device includes a lower contact plug on a substrate, a magnetic tunnel junction pattern on the lower contact plug, a bottom electrode, which is between the lower contact plug and the magnetic tunnel junction pattern and is in contact with a bottom surface of the magnetic tunnel junction pattern, and a top electrode on a top surface of the magnetic tunnel junction pattern. Each of the bottom electrode, the magnetic tunnel junction pattern, and the top electrode has a thickness in a first direction, which is perpendicular to a top surface of the substrate. A first thickness of the bottom electrode is about 0.6 to 1.1 times a second thickness of the magnetic tunnel junction pattern.

20 Claims, 9 Drawing Sheets

MAGNETIC MEMORY DEVICE

CROSS-REFERENCE TO RELATED APPLICATIONS

This U.S. non-provisional patent application claims priority under 35 U.S.C. § 119 to Korean Patent Application No. 10-2019-0068895, filed on Jun. 11, 2019, in the Korean Intellectual Property Office, the entire contents of which are hereby incorporated by reference.

FIELD

The present disclosure relates to semiconductor devices, and in particular, to magnetic memory devices including magnetic tunnel junctions.

BACKGROUND

With increasing demand for electronic devices with increased speed and/or reduced power consumption, semiconductor memory devices with faster operating speeds and/or lower operating voltages may be required. A magnetic memory device has been proposed to satisfy such requirements. For example, the magnetic memory device can provide technical advantages, such as high speed and/or non-volatility, and thus, the magnetic memory device may be emerging as a next-generation memory device.

The magnetic memory device includes a magnetic tunnel junction (MTJ). The MTJ typically includes two magnetic layers and an insulating layer interposed therebetween. Resistance of the MTJ varies depending on magnetization directions of the magnetic layers. For example, the resistance of the MTJ is higher when magnetization directions of the magnetic layers are anti-parallel to each other than when they are parallel to each other. Such a difference in resistance can be used for data storing operations of the magnetic memory device.

SUMMARY

An embodiment of the inventive concept provides magnetic memory devices with excellent or desired characteristics and methods of fabricating the same.

An embodiment of the inventive concept provides magnetic memory devices, which can be more easily fabricated, and methods of fabricating the same.

According to an embodiment of the inventive concept, a magnetic memory device may include a lower contact plug on a substrate, a magnetic tunnel junction pattern on the lower contact plug, a bottom electrode, which is between the lower contact plug and the magnetic tunnel junction pattern and is in contact with a bottom surface of the magnetic tunnel junction pattern, and a top electrode, which is on a top surface of the magnetic tunnel junction pattern. Each of the bottom electrode, the magnetic tunnel junction pattern, and the top electrode may have a thickness in a first direction, which is perpendicular to a top surface of the substrate. A first thickness of the bottom electrode may be about 0.6 to 1.1 times a second thickness of the magnetic tunnel junction pattern.

According to an embodiment of the inventive concept, a magnetic memory device may include an interconnection line on a substrate, a contact, which is between the substrate and the interconnection line and connects the interconnection line to the substrate, a conductive line on the interconnection line, a magnetic tunnel junction pattern between the interconnection line and the conductive line, a lower contact plug, which is between the magnetic tunnel junction pattern and the interconnection line and is adjacent to the interconnection line, a bottom electrode between the magnetic tunnel junction pattern and the lower contact plug, and a top electrode between the magnetic tunnel junction pattern and the conductive line. Each of the bottom electrode, the magnetic tunnel junction pattern, and the top electrode may have a thickness in a first direction perpendicular to a top surface of the substrate. A first thickness of the bottom electrode may be about 0.6 to 1.1 times a second thickness of the magnetic tunnel junction pattern.

According to an embodiment of the inventive concept, a magnetic memory device may include an interconnection structure on a substrate, the interconnection structure including interconnection lines, which are spaced apart from each other in a first direction perpendicular to a top surface of the substrate, and contacts, which are between the interconnection lines, a lower contact plug, which is on the interconnection structure and is connected to an uppermost one of the interconnection lines, a magnetic tunnel junction pattern on the lower contact plug, a bottom electrode between the lower contact plug and the magnetic tunnel junction pattern, a conductive line on the magnetic tunnel junction pattern, and a top electrode between the magnetic tunnel junction pattern and the conductive line. Each of the bottom electrode, the magnetic tunnel junction pattern, and the top electrode may have a thickness in the first direction. A first thickness of the bottom electrode may be about 0.6 to 1.1 times a second thickness of the magnetic tunnel junction pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. As used herein, the singular forms "a," "an" and "the" are intended to include the plural forms as well, unless the context clearly indicates otherwise. The term "and/or" includes any and all combinations of one or more of the associated listed items. When an element is referred to as "on" or "connected to" another element, it can be directly on or connected to the other element, or intervening elements may be present. When an element is referred to as being "directly" on or connected to another element, there are no intervening elements present.

Figure 1:
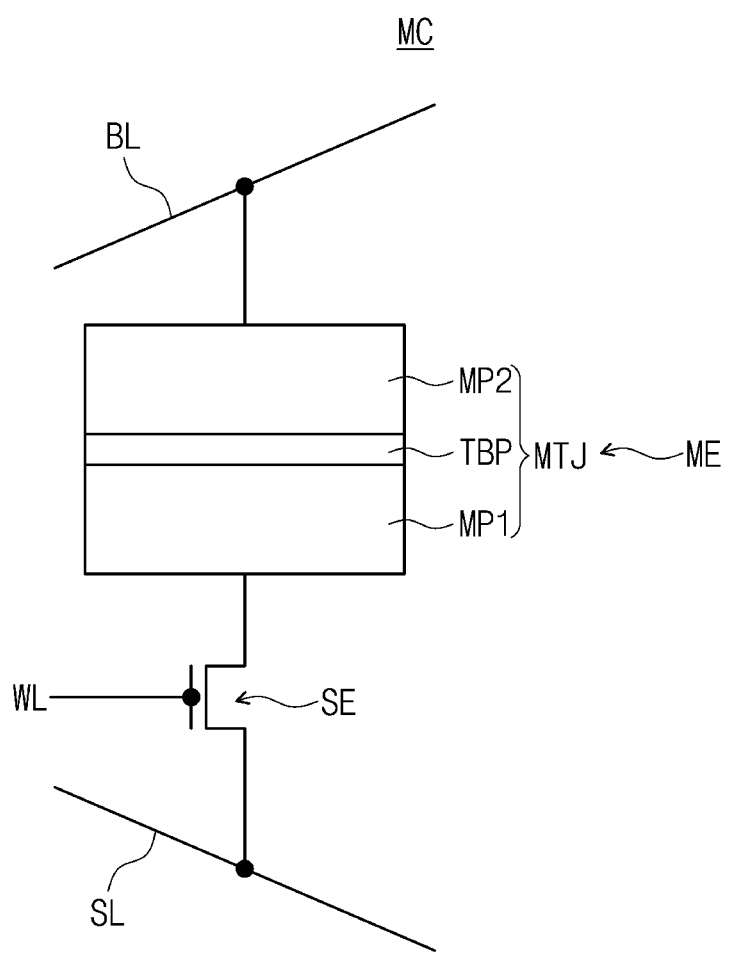
FIG. 1 is a circuit diagram illustrating a unit memory cell of a magnetic memory device according to an embodiment of the inventive concept.

FIG. 1 is a circuit diagram illustrating a unit memory cell of a magnetic memory device according to an embodiment of the inventive concept.

Referring to FIG. 1, a unit memory cell MC may include a memory device ME and a selection element SE. The memory device ME and the selection element SE may be electrically connected to each other in series. The memory device ME may be provided between and connected to a bit line BL and the selection element SE. The selection element SE may be provided between and connected to the memory device ME and a source line SL and may be controlled by a word line WL. The selection element SE may include, for example, a bipolar transistor or a metal-oxide-semiconductor (MOS) field effect transistor.

The memory device ME may include a magnetic tunnel junction MTJ including magnetic patterns MP1 and MP2, which are spaced apart from each other, and a tunnel barrier pattern TBP, which is interposed between the magnetic patterns MP1 and MP2. One of the magnetic patterns MP1 and MP2 may have a fixed magnetization direction, regardless of the presence of an external magnetic field generated under a typical use condition, and thus, it may serve as a reference magnetic pattern of the magnetic tunnel junction MTJ. The other of the magnetic patterns MP1 and MP2 may have a magnetization direction, which can be changed to one of two stable magnetization directions by an external magnetic field, and thus, it may serve as a free magnetic pattern of the magnetic tunnel junction MTJ. The electrical resistance of the magnetic tunnel junction MTJ may be much greater when magnetization directions of the reference and free magnetic patterns are antiparallel than when they are parallel. In other words, the electrical resistance of the magnetic tunnel junction MTJ may be controlled by adjusting the magnetization direction of the free magnetic pattern. Thus, a difference in electrical resistance of the magnetic tunnel junction pattern MTJ, which is caused by a difference in magnetization direction between the reference and free magnetic patterns, may be used as a data storing mechanism in the memory device ME.

Figure 2:
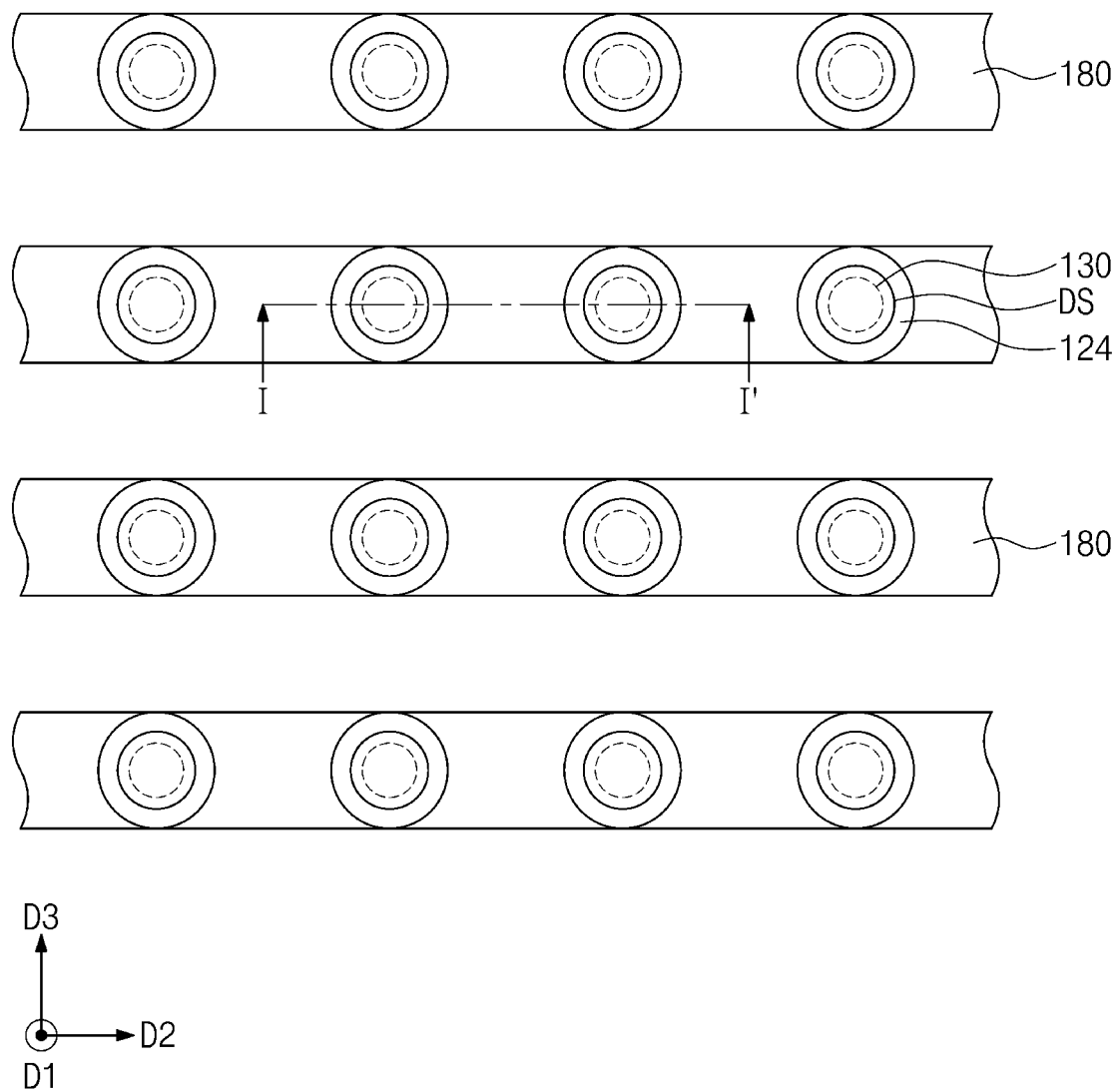
FIG. 2 is a plan view illustrating a magnetic memory device according to an embodiment of the inventive concept.
Figure 3:
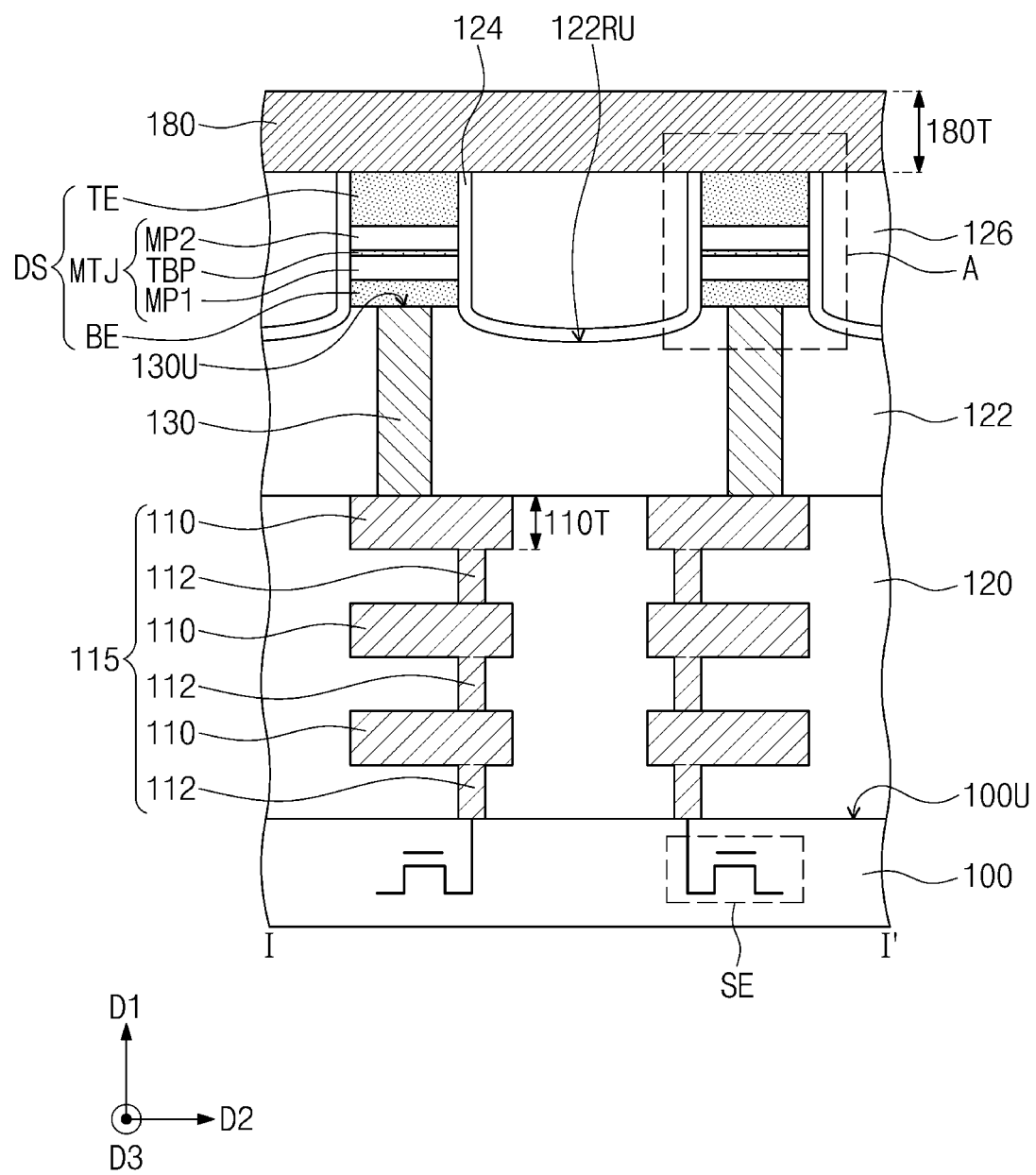
FIG. 3 is a sectional view taken along a line I-I' of FIG. 2.
Figure 4:
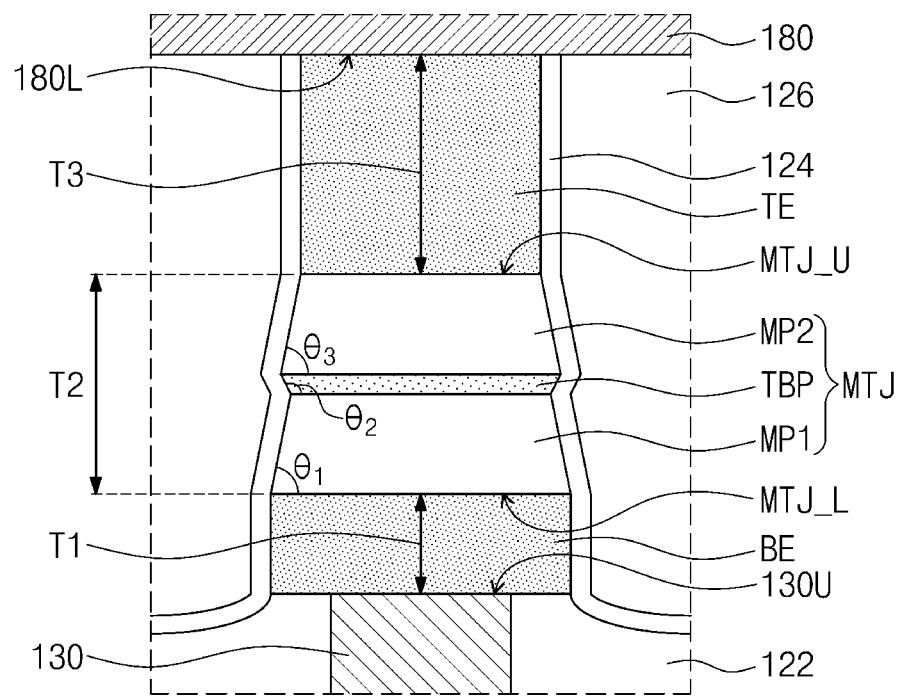
FIG. 4 is an enlarged view of a portion A of FIG. 3.
Figure 4:
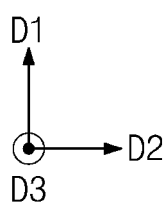
Figure 5A:
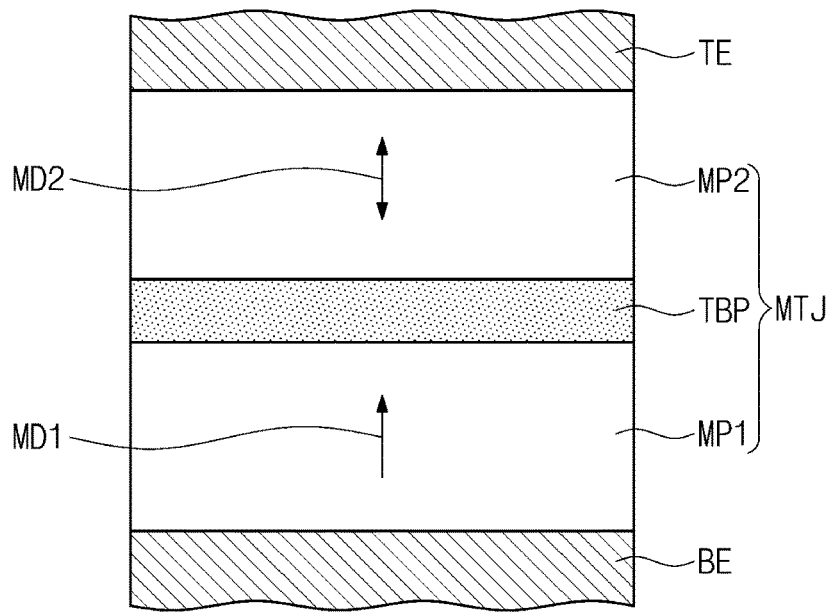
FIGS. 5A and 5B are sectional views illustrating examples of a magnetic tunnel junction pattern of FIG. 3.
Figure 5B:
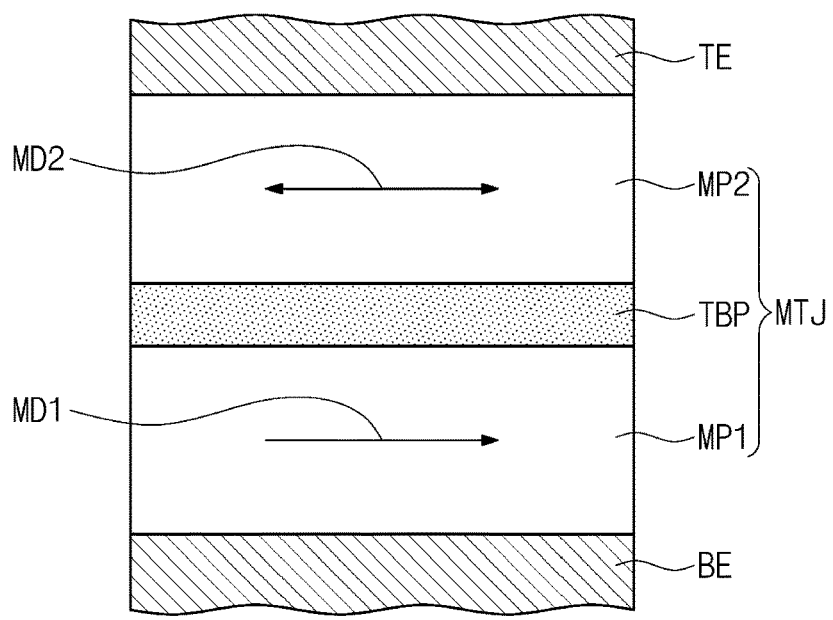

FIG. 2 is a plan view illustrating a magnetic memory device according to an embodiment of the inventive concept. FIG. 3 is a sectional view taken along a line I-I' of FIG. 2, and FIG. 4 is an enlarged view of a portion A of FIG. 3. FIGS. 5A and 5B are sectional views illustrating examples of a magnetic tunnel junction pattern of FIG. 3.

Referring to FIGS. 2 and 3, an interconnection structure 115 may be disposed on a substrate 100. The substrate 100 may be a semiconductor substrate, such as silicon, silicon-on-insulator (SOI), silicon germanium (SiGe), germanium (Ge), and gallium arsenide (GaAs) wafers. The interconnection structure 115 may include interconnection lines 110, which are spaced apart from each other in a first direction D1 perpendicular to a top surface 100U of the substrate 100. The interconnection lines 110 may extend in a second direction D2, which is parallel to the top surface 100U of the substrate 100. The terms first, second, etc. may be used herein to distinguish one element from another element, and these elements should not be limited by these terms. Spatially relative terms, such as "beneath," "below," "lower," "above," "upper," and the like, are used for ease of description to describe one element's or feature's relationship to another element(s) or feature(s), but it will be understood that the spatially relative terms are intended to encompass different orientations of the device in use or operation in addition to the orientation depicted in the figures.

The lowermost ones of the interconnection lines 110 may be spaced apart from the substrate 100 in the first direction D1. The interconnection structure 115 may include contacts 112, which are disposed between the lowermost interconnection lines 110 and the substrate 100 and between the interconnection lines 110. Some of the contacts 112 may connect the lowermost interconnection lines 110 to the substrate 100, and others of the contacts 112 may connect the interconnection lines 110 to each other. The uppermost ones of the interconnection lines 110 may be connected to corresponding ones of the interconnection lines 110 through the contacts 112 connected thereto. The uppermost interconnection lines 110 may be electrically connected to the lowermost interconnection lines 110 through the contacts 112 and the interconnection lines 110, which are connected thereto. The interconnection lines 110 and the contacts 112 may be formed of or include a metallic material (e.g., copper).

The selection elements SE may be disposed in the substrate 100. As an example, the selection elements SE may be field effect transistors. The lowermost interconnection lines 110 may be electrically connected to terminals of the selection elements SE through the contacts 112 connected thereto. A first interlayered insulating layer 120 may be disposed on the substrate 100 to extend on or cover the interconnection structure 115. As used herein, the term "cover" may not necessarily require complete coverage. Top surfaces of the uppermost interconnection lines 110 may be substantially coplanar with a top surface of the first interlayered insulating layer 120. As an example, the top surfaces of the uppermost interconnection lines 110 may be located at the same height as the top surface of the first interlayered insulating layer 120. In the present specification, the height may mean a distance measured from the top surface 100U of the substrate 100 in the first direction D1. The first interlayered insulating layer 120 may be formed of or include oxide, nitride, and/or oxynitride.

A second interlayered insulating layer 122 may be disposed on the first interlayered insulating layer 120 and may extend on or cover the top surfaces of the uppermost interconnection lines 110. The second interlayered insulating layer 122 may be formed of or include oxide, nitride, and/or oxynitride.

Lower contact plugs 130 may be disposed in the second interlayered insulating layer 122 and may be located on the interconnection structure 115. The lower contact plugs 130 may be two-dimensionally arranged in the second direction D2 and a third direction D3, on the interconnection structure 115. The third direction D3 may be parallel to the top surface 100U of the substrate 100 and may cross the second direction D2. Each of the lower contact plugs 130 may be provided to penetrate or extend through the second interlayered insulating layer 122 and may be connected to a corresponding one of the uppermost interconnection lines 110. As an example, each of the lower contact plugs 130 may be in contact with a top surface of a corresponding one of the uppermost interconnection line 110. Each of the lower contact plugs 130 may be electrically connected to a terminal of a corresponding one of the selection elements SE through corresponding ones of the interconnection lines 110, and corresponding ones of the contacts 112. The lower contact plugs 130 may be formed of or include a metallic material (e.g., tungsten, titanium, copper, and/or tantalum).

Data storage structures DS may be disposed on the lower contact plugs 130. The data storage structures DS may be two-dimensionally arranged in the second and third directions D2 and D3 and may be disposed on the lower contact plugs 130, respectively. The second interlayered insulating layer 122 may have a recessed top surface 122RU, which is formed between the data storage structures DS. The recessed top surface 122RU of the second interlayered insulating layer 122 may be located at a height lower than a top surface 130U of each of the lower contact plugs 130.

Third interlayered insulating layer 126 may be disposed on the second interlayered insulating layer 122 to extend on or cover the data storage structures DS. The third interlayered insulating layer 126 may extend on or cover the recessed top surface 122RU of the second interlayered insulating layer 122 and may extend on or cover side surfaces of the data storage structures DS. A protection insulating layer 124 may be interposed between the side surface of each of the data storage structures DS and the third interlayered insulating layer 126. The protection insulating layer 124 may be provided to surround the side surface of each of the data storage structures DS, when viewed in a plan view. The protection insulating layer 124 may extend from the side surface of each of the data storage structures DS into a region between the second interlayered insulating layer 122 and the third interlayered insulating layer 126. The protection insulating layer 124 may be interposed between the recessed top surface 122RU of the second interlayered insulating layer 122 and the third interlayered insulating layer 126. The protection insulating layer 124 may be formed of or include nitride (e.g., silicon nitride), and the third interlayered insulating layer 126 may be formed of or include oxide, nitride, and/or oxynitride.

Conductive lines 180 may be disposed on the third interlayered insulating layer 126. The conductive lines 180 may extend in the second direction D2 and may be spaced apart from each other in the third direction D3. Each of the conductive lines 180 may be connected in common to some (i.e., multiple) of the data storage structures DS, which are arranged in the second direction D2. The conductive lines 180 may be formed of or include a metallic material (e.g., copper). The conductive lines 180 may serve as bit lines.

Each of the uppermost interconnection lines 110 and the conductive lines 180 may have a thickness in the first direction Dl. In some embodiments, a thickness 180T of each of the conductive lines 180 may be greater than a thickness 110T of each of the uppermost interconnection lines 110. As an example, the thickness 180T of each of the conductive lines 180 may be about two times the thickness 110T of each of the uppermost interconnection lines 110 (i.e., 180T=2×110T).

Referring to FIGS. 3 and 4, each of the data storage structures DS may include a bottom electrode BE, a magnetic tunnel junction pattern MTJ, and a top electrode TE, which are sequentially stacked on each of the lower contact plugs 130. The bottom electrode BE may be interposed between each of the lower contact plugs 130 and the magnetic tunnel junction pattern MTJ, and the top electrode TE may be interposed between a corresponding one of the conductive lines 180 and the magnetic tunnel junction pattern MTJ. The magnetic tunnel junction pattern MTJ may include a first magnetic pattern MP1, a second magnetic pattern MP2, and a tunnel barrier pattern TBP therebetween. The first magnetic pattern MP1 may be disposed between the bottom electrode BE and the tunnel barrier pattern TBP, and the second magnetic pattern MP2 may be disposed between the top electrode TE and the tunnel barrier pattern TBP.

The bottom electrode BE may be in contact with and extend beyond edges of the top surface 130U of each of the lower contact plugs 130 and may extend from the top surface 130U of each of the lower contact plugs 130 in the first direction D1 to be in contact with a bottom surface MTJ_L of the magnetic tunnel junction pattern MTJ. The bottom surface MTJ_L of the magnetic tunnel junction pattern MTJ may correspond to a bottom surface of the first magnetic pattern MP1. The bottom electrode BE may be formed of or include metal nitride (e.g., TiN). The bottom electrode BE may be a single or monolithic layer, which extends from the top surface 130U of each of the lower contact plugs 130 to the bottom surface MTJ_L of the magnetic tunnel junction pattern MTJ. As used herein, a "monolithic" layer may refer to a continuous or unitary layer. As an example, the bottom electrode BE may be a single or monolithic layer of metal nitride (e.g., of TiN).

The top electrode TE may be in contact with a top surface MTJ_U of the magnetic tunnel junction pattern MTJ and may extend from the top surface MTJ_U of the magnetic tunnel junction pattern MTJ in the first direction D1 to be in contact with a bottom surface 180L of the corresponding conductive line 180. The conductive line 180 may extend in a second direction D2 beyond edges of the top electrode TE. The top surface MTJ_U of the magnetic tunnel junction pattern MTJ may correspond to a top surface of the second magnetic pattern MP2. The top electrode TE may be formed of or include at least one of a non-magnetic metal (e.g., W) or metal nitride (e.g., TiN). As an example, the top electrode TE may be formed of or include the same metal nitride as the bottom electrode BE. The top electrode TE may be a single or monolithic layer, which extends from the top surface MTJ_U of the magnetic tunnel junction pattern MTJ to the bottom surface 180L of the corresponding conductive line 180. As an example, the top electrode TE may be a single or monolithic layer of metal nitride (e.g., of TiN).

Each of the bottom electrode BE, the magnetic tunnel junction pattern MTJ, and the top electrode TE may have a thickness in the first direction D1. A first thickness T1 of the bottom electrode BE may be about 0.6 to 1.1 times a second thickness T2 of the magnetic tunnel junction pattern MTJ (i.e., 0.6 T2≤T1≤1.1 T2). In the case where the first thickness T1 is smaller than 0.6 times of the second thickness T2 (i.e., T1<0.6 T2), surface roughness of the bottom electrode BE may be increased. In this case, the surface roughness of the bottom electrode BE may be transcribed or transferred to the magnetic tunnel junction pattern MTJ, which may lead to a difficulty in crystal growth of the magnetic tunnel junction pattern MTJ. In the case where the first thickness T1 is greater than 1.1 times of the second thickness T2 (i.e., T1>1.1 T2), it may be difficult to etch a bottom electrode layer during an etching process for forming the bottom electrode BE. The first thickness T1 of the bottom electrode BE may therefore be critical to the formation and characteristics of the bottom electrode BE and the magnetic tunnel junction pattern MTJ thereon.

A third thickness T3 of the top electrode TE may be about 1.2 to 1.9 times the second thickness T2 of the magnetic tunnel junction pattern MTJ (i.e., 1.2 T2≤T3≤1.9 T2). In the case where the third thickness T3 is smaller than 1.2 times the second thickness T2 (i.e., T3<1.2 T2), a metallic element (e.g., Cu) in the corresponding conductive line 180 may be more easily diffused into the tunnel barrier pattern TBP in the magnetic tunnel junction pattern MTJ, thereby deteriorating electrical characteristics of the magnetic tunnel junction pattern MTJ. In the case where the third thickness T3 is greater than 1.9 times the second thickness T2 (i.e., T3>1.9 T2), it may be difficult to etch a magnetic tunnel junction layer during an etching process for forming the magnetic tunnel junction pattern MTJ. The third thickness T3 of the top electrode TE may therefore be critical to the formation and characteristics of the magnetic tunnel junction pattern MTJ and the tunnel barrier pattern TBP thereof.

As an example, the second thickness T2 of the magnetic tunnel junction pattern MTJ may range from about 180 Å to about 200 Å. In this case, the first thickness T1 of the bottom electrode BE may range from about 120 Å to about 200 Å, and the third thickness T3 of the top electrode TE may range from about 240 Å to about 360 Å.

In some embodiments, a side surface of the first magnetic pattern MP1 may be inclined at an angle to a bottom surface of the first magnetic pattern MP1 (e.g., the bottom surface MTJ_L of the magnetic tunnel junction pattern MTJ). A first angle θ1 between the side surface of the first magnetic pattern MP1 and the bottom surface of the first magnetic pattern MP1 may be an acute angle. A side surface of the tunnel barrier pattern TBP may be inclined at an angle to a bottom surface of the tunnel barrier pattern TBP (e.g., an interface between the tunnel barrier pattern TBP and the first magnetic pattern MP1). A second angle θ2 between the side surface of the tunnel barrier pattern TBP and the bottom surface of the tunnel barrier pattern TBP may be an obtuse angle. A side surface of the second magnetic pattern MP2 may be inclined at an angle to a bottom surface of the second magnetic pattern MP2 (e.g., an interface between the tunnel barrier pattern TBP and the second magnetic pattern MP2). A third angle θ3 between the side surface of the second magnetic pattern MP2 and the bottom surface of the second magnetic pattern MP2 may be an acute angle.

Referring to FIGS. 3, 5A, and 5B, the first magnetic pattern MP1 may be a reference layer, whose magnetization direction MD1 is fixed to a specific direction, and the second magnetic pattern MP2 may be a free layer, whose magnetization direction MD2 can be changed to be parallel or antiparallel to the magnetization direction MD1 of the first magnetic pattern MP1. FIGS. 5A and 5B illustrate an example, in which the second magnetic pattern MP2 is used as the free layer, but the inventive concept is not limited to this example. In an embodiment, unlike the structure shown in FIGS. 5A and 5B, the first magnetic pattern MP1 may be the free layer and the second magnetic pattern MP2 may be the reference layer. Referring to FIG. 5A, as an example, the magnetization directions MD1 and MD2 of the first and second magnetic patterns MP1 and MP2 may be perpendicular to the interface between the tunnel barrier pattern TBP and the second magnetic pattern MP2. In this case, each of the first and second magnetic patterns MP1 and MP2 may include at least one of perpendicular magnetic materials (e.g., CoFeTb, CoFeGd, and CoFeDy), perpendicular magnetic materials with L10 structure, CoPt-based materials with hexagonal-close-packed structure, and perpendicular magnetic structures. The perpendicular magnetic material with the L10 structure may include at least one of L10 FePt, L10 FePd, L10 CoPd, or L10 CoPt. The perpendicular magnetic structures may include magnetic layers and non-magnetic layers that are alternately and repeatedly stacked. For example, the perpendicular magnetic structures may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n denotes the number of stacking or number of pairs of alternately stacked layers. Referring to FIG. 5B, as another example, the magnetization directions MD1 and MD2 of the first and second magnetic patterns MP1 and MP2 may be parallel to the interface between the tunnel barrier pattern TBP and the second magnetic pattern MP2. In this case, each of the first and second magnetic patterns MP1 and MP2 may include a ferromagnetic material. The first magnetic pattern MP1 may further include an anti-ferromagnetic material, which is provided in the first magnetic pattern MP1 and is used to fix a magnetization direction of the ferromagnetic material.

The tunnel barrier pattern TBP may include at least one of, for example, magnesium oxide, titanium oxide, aluminum oxide, magnesium-zinc oxide, or magnesium-boron oxide.

According to an embodiment of the inventive concept, the data storage structure DS may be configured such that the first thickness T1 of the bottom electrode BE is about 0.6 to 1.1 times the second thickness T2 of the magnetic tunnel junction pattern MTJ. In this case, it may be possible to more easily perform the crystal growth process for forming the magnetic tunnel junction pattern MTJ and to more easily form the bottom electrode BE through an etching process for forming the bottom electrode BE. In addition, the data storage structure DS may be configured such that the third thickness T3 of the top electrode TE is about 1.2 to 1.9 times the second thickness T2 of the magnetic tunnel junction pattern MTJ. In this case, it may be possible to reduce or prevent a metallic element (e.g., Cu) in the corresponding conductive line 180 from being diffused into the tunnel barrier pattern TBP in the magnetic tunnel junction pattern MTJ and to form the magnetic tunnel junction pattern MTJ through an etching process for forming the magnetic tunnel junction pattern MTJ. Accordingly, it may be possible to more easily fabricate a magnetic memory device having excellent or desired characteristics.

FIGS. 6 to 9 are sectional views, which are taken along a line I-I' of FIG. 2 to illustrate a method of fabricating a magnetic memory device, according to an embodiment of the inventive concept. In the following description, an element or a fabrication step previously described with reference to FIGS. 2 to 4, 5A, and 5B may be identified by the same reference number without repeating the description thereof, for brevity.

Figure 6:
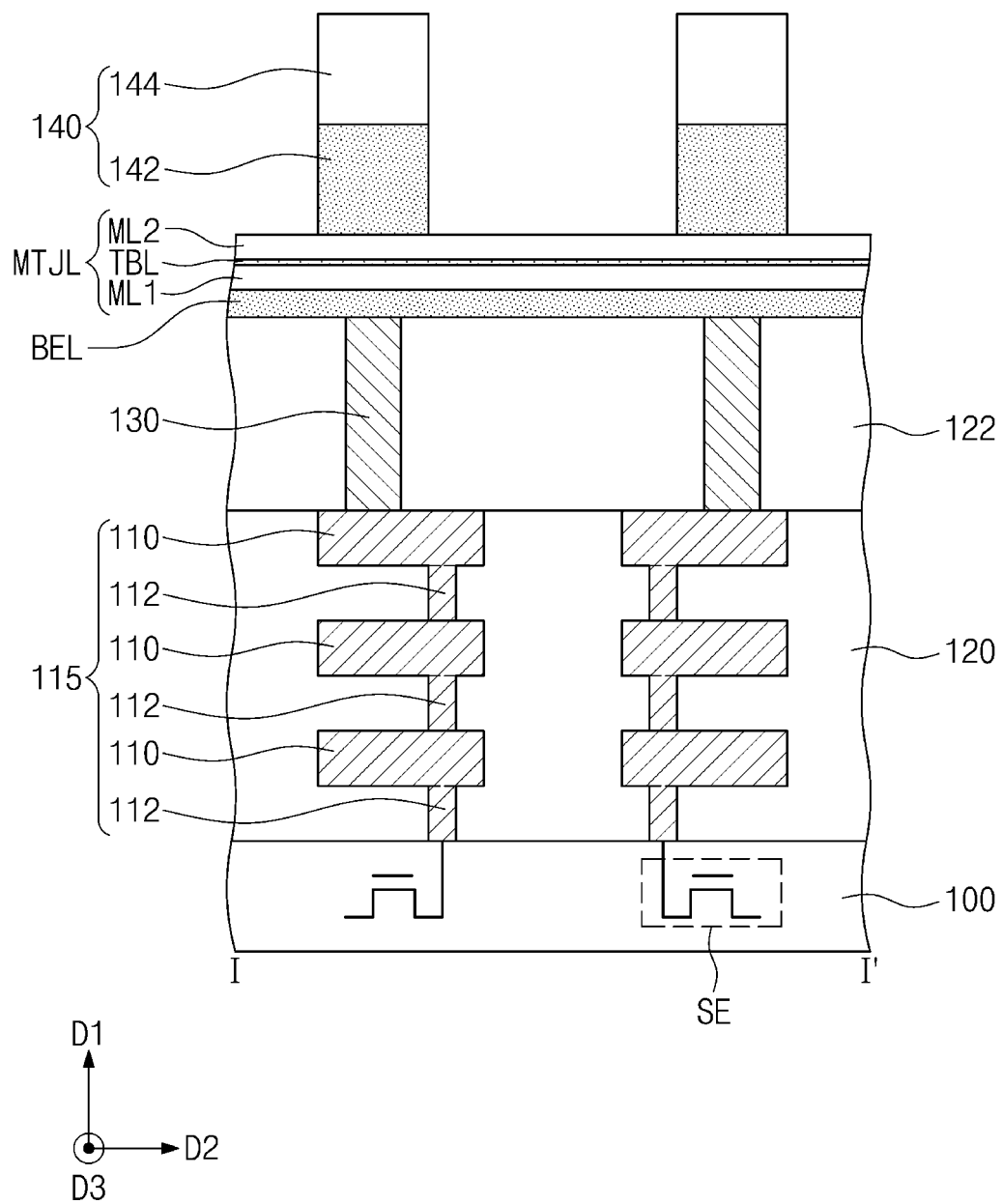
FIGS. 6 to 9 are sectional views, which are taken along a line I-I' of FIG. 2 to illustrate a method of fabricating a magnetic memory device, according to an embodiment of the inventive concept.

Referring to FIGS. 2 and 6, selection elements SE may be formed in the substrate 100, and interconnection structure 115 may be formed on the substrate 100. The interconnection structure 115 may include interconnection lines 110, which are spaced apart from each other in the first direction D1, and contacts 112, which are connected to the interconnection lines 110. The lowermost ones of the interconnection lines 110 may be formed to be electrically connected to the substrate 100 through the contacts 112 connected thereto. As an example, the lowermost interconnection lines 110 may be formed to be electrically connected to the selection elements SE through the contacts 112 connected thereto. The uppermost ones of the interconnection lines 110 may be formed to be connected to corresponding ones of the interconnection lines 110 through the contacts 112 connected thereto. The uppermost interconnection lines 110 may be formed to be electrically connected to the lowermost interconnection lines 110 through the contacts 112 and the interconnection lines 110, which are connected thereto. A first interlayered insulating layer 120 may be formed on the substrate 100 to extend on or cover the interconnection structure 115. In some embodiments, top surfaces of the uppermost interconnection lines 110 may be substantially coplanar with a top surface of the first interlayered insulating layer 120.

A second interlayered insulating layer 122 may be formed on the first interlayered insulating layer 120 to extend on or cover the top surfaces of the uppermost interconnection lines 110. Lower contact plugs 130 may be formed in the second interlayered insulating layer 122. The lower contact plugs 130 may be formed to be spaced apart from each other in the second and third directions D2 and D3, when viewed in a plan view. The formation of the lower contact plugs 130 may include forming vertical holes (e.g., holes extending in the first direction D1) to penetrate or extend through the second interlayered insulating layer 122, forming a contact conductive layer on the second interlayered insulating layer 122 to fill the vertical holes, and planarizing the contact conductive layer to expose the second interlayered insulating layer 122. As a result of the planarization process, the lower contact plugs 130 may be locally formed in the vertical holes. Each of the lower contact plugs 130 may be formed to penetrate or extend through the second interlayered insulating layer 122 and may be connected to a corresponding one of the uppermost interconnection lines 110.

A bottom electrode layer BEL and a magnetic tunnel junction layer MTJL may be sequentially formed on the second interlayered insulating layer 122. The bottom electrode layer BEL may be formed to extend on or cover top surfaces of the lower contact plugs 130 and a top surface of the second interlayered insulating layer 122. The magnetic tunnel junction layer MTJL may include a first magnetic layer ML1, a tunnel barrier layer TBL, and a second magnetic layer ML2, which are sequentially stacked on the bottom electrode layer BEL. The bottom electrode layer BEL may be formed of or include metal nitride (e.g., TiN). The bottom electrode layer BEL may be a single or monolithic layer of metal nitride. The first magnetic layer ML1, the tunnel barrier layer TBL, and the second magnetic layer ML2 may be formed of or include the same materials as the first magnetic pattern MP1, the tunnel barrier pattern TBP, and the second magnetic pattern MP2, respectively, described with reference to FIGS. 5A and 5B. The bottom electrode layer BEL and the magnetic tunnel junction layer MTJL may be formed by, for example, a sputtering deposition process.

Mask patterns 140 may be formed on the magnetic tunnel junction layer MTJL. When viewed in a plan view, the mask patterns 140 may be spaced apart from each other in the second and third directions D2 and D3 and may define regions, on which data storage structures DS will be formed. Each of the mask patterns 140 may include a lower mask pattern 142 and an upper mask pattern 144, which are sequentially stacked on the magnetic tunnel junction layer MTJL. The lower mask pattern 142 may be interposed between the magnetic tunnel junction layer MTJL and the upper mask pattern 144. The lower mask pattern 142 may be formed of or include at least one of non-magnetic metal (e.g., W) and metal nitride (e.g., TiN). As an example, the lower mask pattern 142 may include the same metal nitride as the bottom electrode layer BEL. The lower mask pattern 142 may be a single or monolithic layer of metal nitride. The upper mask pattern 144 may be formed of or include an insulating material (e.g., oxide, nitride, and/or oxynitride).

Figure 7:
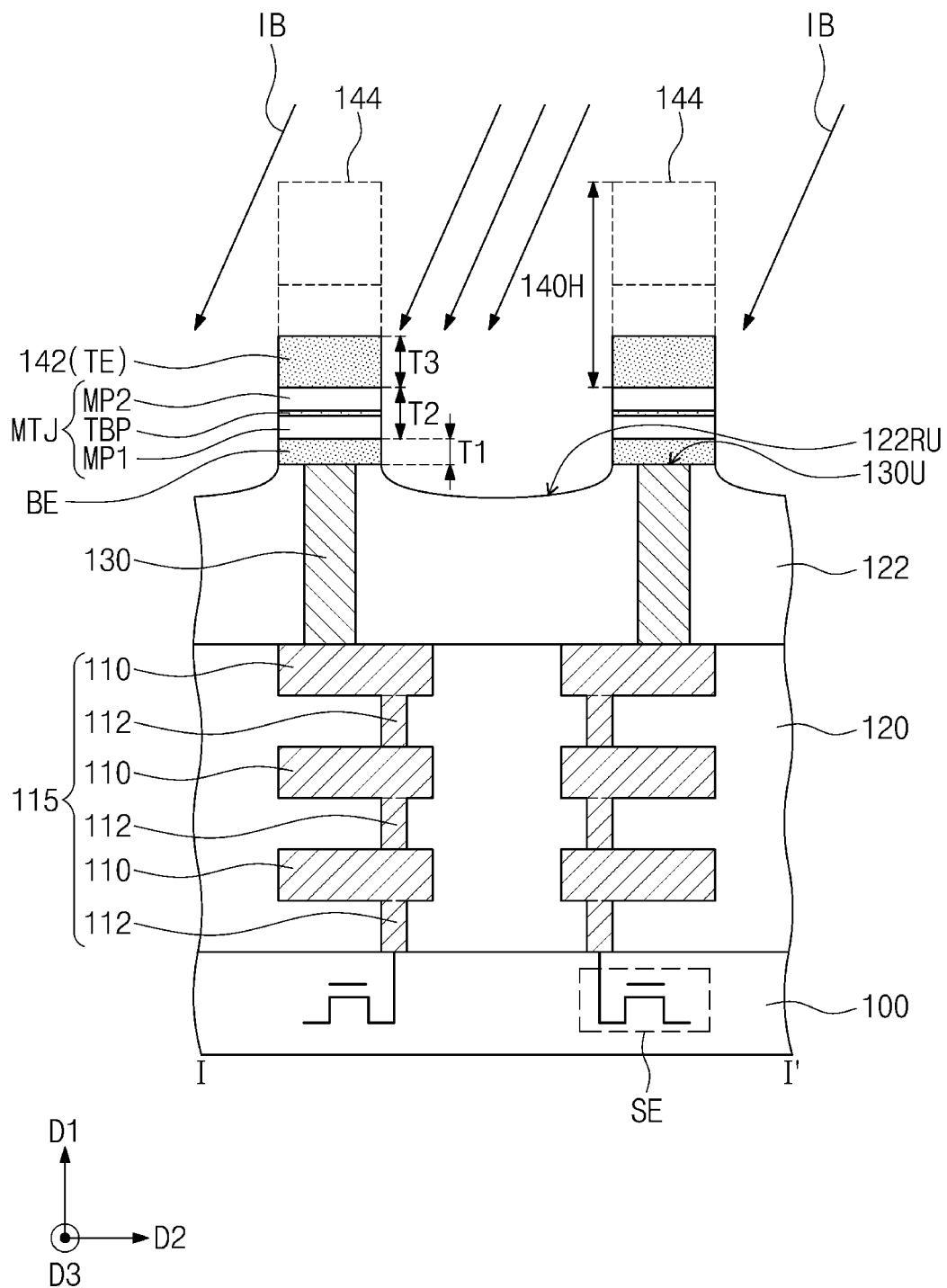

Referring to FIGS. 2 and 7, an etching process may be performed using the mask patterns 140 as an etch mask. The etching process may be an ion beam etching process using an ion beam IB, and in an embodiment, the ion beam IB may include positively-charged argon ions ($Ar^+$). The magnetic tunnel junction layer MTJL and the bottom electrode layer BEL may be sequentially etched by the etching process, and as a result, a magnetic tunnel junction pattern MTJ and a bottom electrode BE may be formed. The first magnetic layer ML1, the tunnel barrier layer TBL, and the second magnetic layer ML2 may be etched by the etching process to form a first magnetic pattern MP1, a tunnel barrier pattern TBP, and a second magnetic pattern MP2. The magnetic tunnel junction pattern MTJ may include the first magnetic pattern MP1, the tunnel barrier pattern TBP, and the second magnetic pattern MP2, which are sequentially stacked on the bottom electrode BE. The upper mask pattern 144 of each of the mask patterns 140 may be removed, during the etching process. At least a portion of the lower mask pattern 142 of each of the mask patterns 140 may remain on the magnetic tunnel junction pattern MTJ, after the etching process. The remaining portion of the lower mask pattern 142 may serve as a top electrode TE.

According to an embodiment of the inventive concept, the bottom electrode BE, the magnetic tunnel junction pattern MTJ, and the top electrode TE may be formed to have a first thickness T1, a second thickness T2, and a third thickness T3, respectively. The first thickness T1 of the bottom electrode BE may be about 0.6 to 1.1 times the second thickness T2 of the magnetic tunnel junction pattern MTJ, and the third thickness T3 of the top electrode TE may be about 1.2 to 1.9 times the second thickness T2 of the magnetic tunnel junction pattern MTJ. In the case where the first thickness T1 is greater than 1.1 times of the second thickness T2, it may be difficult to etch the bottom electrode layer BEL during the etching process and thereby to form the bottom electrode BE. In the case where the third thickness T3 is greater than 1.9 times the second thickness T2, each of the mask patterns 140 may have a relatively large total height 140H. In this case, the ion beam IB may be blocked by the mask patterns 140 during the etching process, and this may lead to technical difficulties in etching the magnetic tunnel junction layer MJTL and thereby in forming the magnetic tunnel junction pattern MTJ.

In some embodiments, as a result of the etching process, the second interlayered insulating layer 122 may be formed to have a recessed top surface 122RU between the data storage structures DS. The recessed top surface 122RU of the second interlayered insulating layer 122 may be located at a height lower than a top surface 130U of each of the lower contact plugs 130. In some embodiments, the etching process may be performed to allow each of the first magnetic pattern MP1, the second magnetic pattern MP2, and the tunnel barrier pattern TBP to have an inclined side surface, as described with reference to FIG. 4. Thus, it may be possible to reduce or prevent or suppress a conductive contamination material, which is produced during the etching process, from being re-deposited on the side surface of the tunnel barrier pattern TBP, and thereby to reduce or prevent a short circuit from being formed between the first and second magnetic patterns MP1 and MP2.

Figure 8:
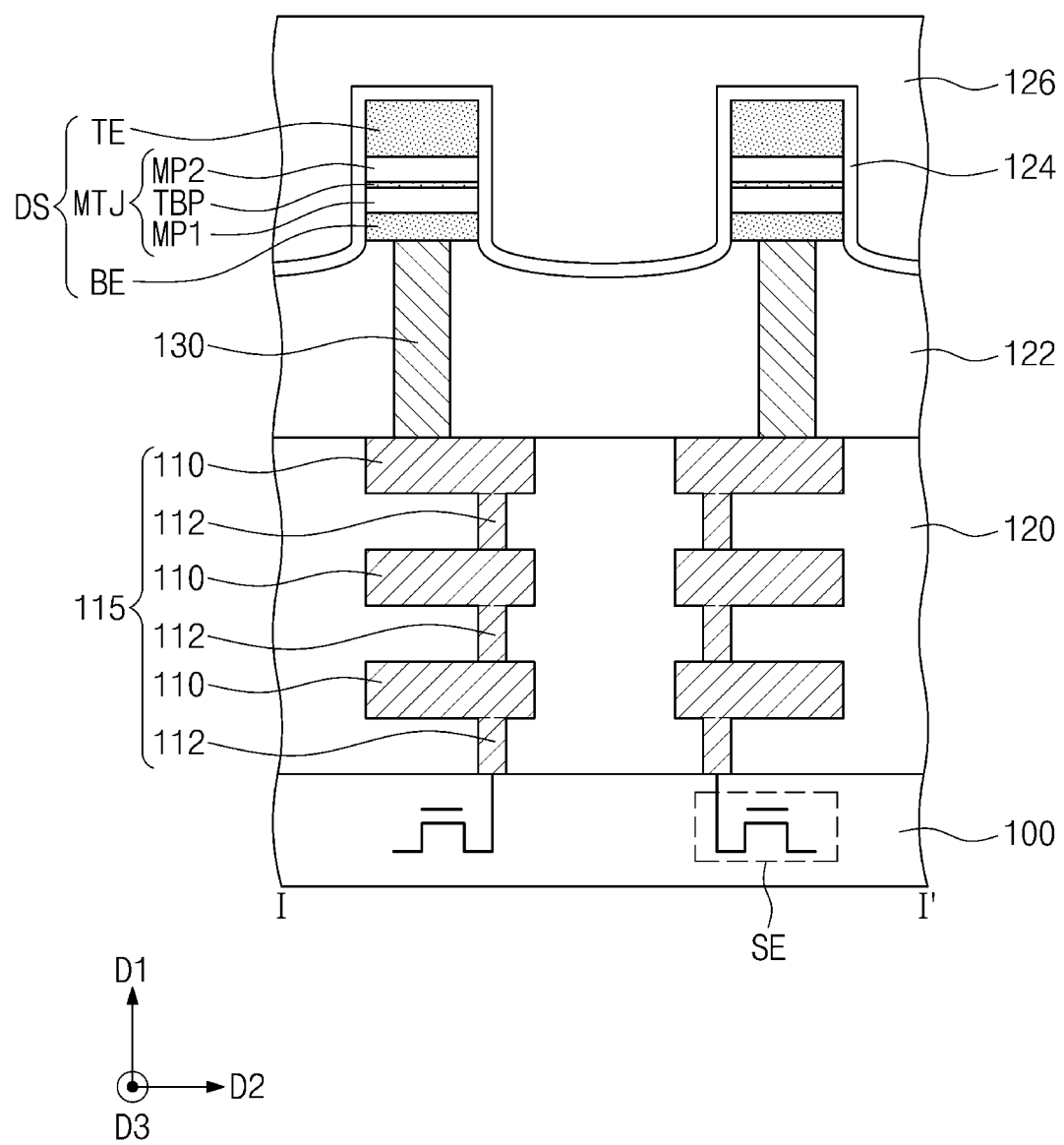

Referring to FIGS. 2 and 8, the bottom electrode BE, the magnetic tunnel junction pattern MTJ, and the top electrode TE may constitute a data storage structure DS. In an embodiment, a plurality of the data storage structures DS may be formed to be disposed on the lower contact plugs 130, respectively. When viewed in a plan view, the plurality of data storage structures DS may be formed to be spaced apart from each other in the second and third directions D2 and D3.

A protection insulating layer 124 and a third interlayered insulating layer 126 may be sequentially formed on the second interlayered insulating layer 122. The third interlayered insulating layer 126 may extend on or cover the recessed top surface 122RU of the second interlayered insulating layer 122 and may extend on or cover the plurality of data storage structures DS. The protection insulating layer 124 may be interposed between the recessed top surface 122RU of the second interlayered insulating layer 122 and the third interlayered insulating layer 126 and may extend into a region between each of the data storage structures DS and the third interlayered insulating layer 126.

Figure 9:
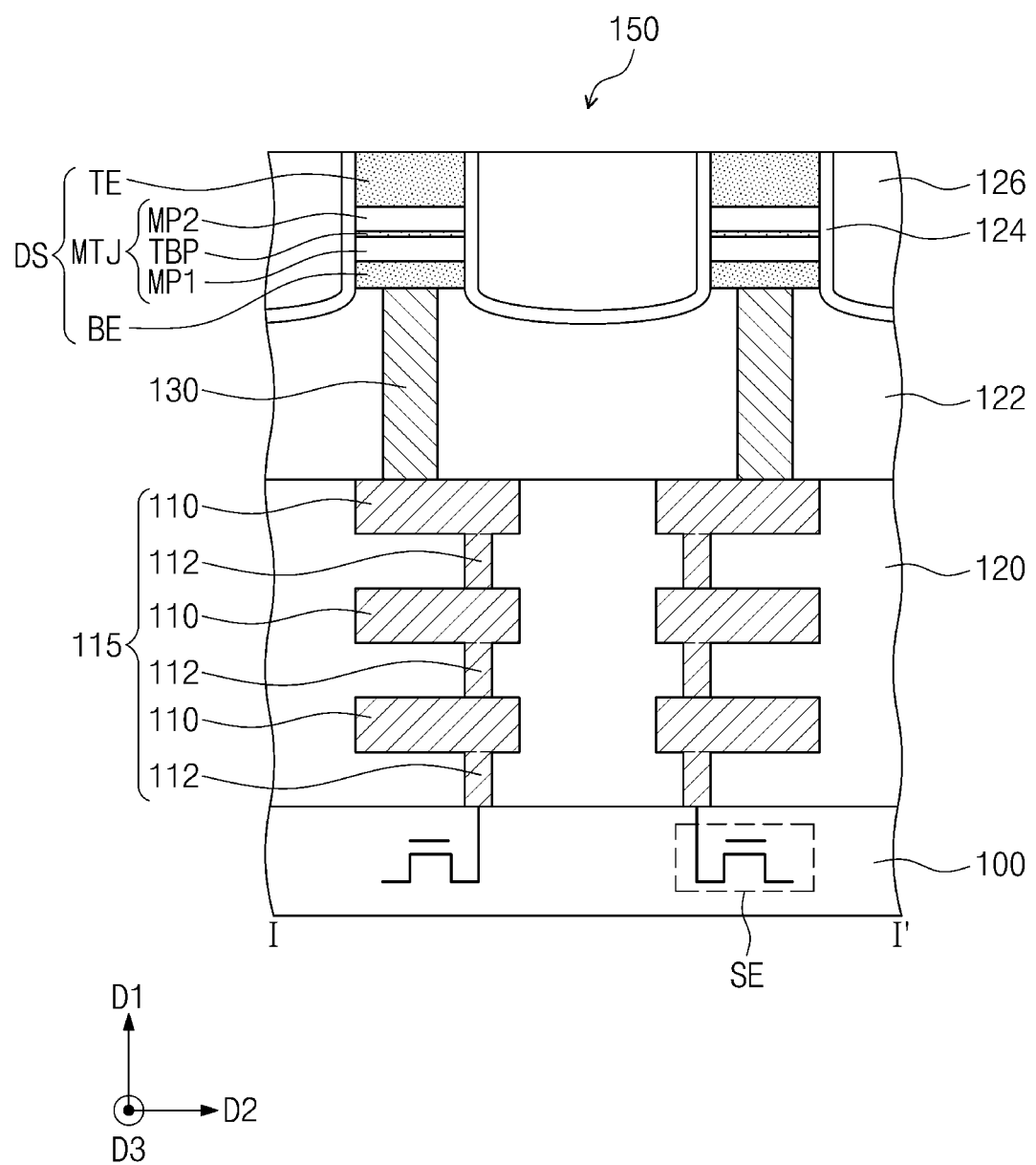

Referring to FIGS. 2 and 9, a plurality of trenches 150 may be formed in the third interlayered insulating layer 126. The plurality of trenches 150 may extend in the second direction D2 and may be spaced apart from each other in the third direction D3. Each of the plurality of trenches 150 may be formed to penetrate or extend through a portion of the protection insulating layer 124 and to expose corresponding ones of the data storage structures DS, which are arranged in the second direction D2. Each of the plurality of trenches 150 may be formed to expose the top surface of the top electrode TE of a corresponding one of the data storage structures DS.

Referring back to FIGS. 2 and 3, conductive lines 180 may be formed in the plurality of trenches 150, respectively. The formation of the conductive lines 180 may include forming a conductive layer on the third interlayered insulating layer 126 to fill the plurality of trenches 150 and planarizing the conductive layer to expose the third interlayered insulating layer 126. As a result of the planarization process, the conductive lines 180 may be locally formed in the plurality of trenches 150.

According to an embodiment of the inventive concept, the data storage structure DS may be configured such that the first thickness T1 of the bottom electrode BE is about 0.6 to 1.1 times the second thickness T2 of the magnetic tunnel junction pattern MTJ. Accordingly, the surface roughness of the bottom electrode BE may be decreased, and this may make it possible to more easily perform the crystal growth process for forming the magnetic tunnel junction pattern MTJ and to more easily form the bottom electrode BE through an etching process for forming the bottom electrode BE. In addition, the data storage structure DS may be configured such that the third thickness T3 of the top electrode TE is about 1.2 to 1.9 times the second thickness T2 of the magnetic tunnel junction pattern MTJ. Accordingly, it may be possible to reduce or prevent diffusion of a metallic element in the conductive lines 180 and to more easily form the magnetic tunnel junction pattern MTJ during an etching process for forming the magnetic tunnel junction pattern MTJ.

Accordingly, it may be possible to more easily fabricate a magnetic memory device having excellent or desired characteristics.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
a lower contact plug on a substrate;
a magnetic tunnel junction pattern on the lower contact plug;
a bottom electrode, which is between the lower contact plug and the magnetic tunnel junction pattern and is in contact with a bottom surface of the magnetic tunnel junction pattern; and
a top electrode on a top surface of the magnetic tunnel junction pattern,
wherein the bottom electrode and the top electrode are spaced apart from each other in a first direction, and
wherein a first thickness of the bottom electrode in the first direction is about 0.6 to 1.1 times a second thickness of the magnetic tunnel junction pattern in the first direction.

2. The magnetic memory device of claim 1, wherein the bottom electrode comprises metal nitride.

3. The magnetic memory device of claim 1, wherein the bottom electrode is a monolithic layer of metal nitride.

4. The magnetic memory device of claim 1, wherein a third thickness of the top electrode in the first direction is about 1.2 to 1.9 times the second thickness of the magnetic tunnel junction pattern in the first direction.

5. The magnetic memory device of claim 4, wherein the top electrode comprises at least one of non-magnetic metal or metal nitride, and further comprising:
an insulating layer, wherein the lower contact plug is in the insulating layer, and wherein a bottom surface of the bottom electrode contacts both the insulating layer and the lower contact plug.

6. The magnetic memory device of claim 4, wherein the top electrode is a monolithic layer of metal nitride.

7. The magnetic memory device of claim 1, wherein the bottom electrode is in contact with and extends beyond edges of a top surface of the lower contact plug, and further comprising:
an interconnection structure between the substrate and the lower contact plug,
wherein the interconnection structure comprises:
interconnection lines on the substrate and spaced apart from each other in the first direction; and
contacts between the interconnection lines,
wherein the lower contact plug is connected to an uppermost one of the interconnection lines.

8. The magnetic memory device of claim 7, further comprising:
a conductive line on the top electrode and extending in a second direction beyond edges of the top electrode, wherein the second direction is perpendicular to the first direction,
wherein the top electrode is between the conductive line and the magnetic tunnel junction pattern, and wherein a fourth thickness of the conductive line in the first direction is greater than a fifth thickness of the uppermost one of the interconnection lines in the first direction.

9. The magnetic memory device of claim 8, wherein the top electrode is in contact with the top surface of the magnetic tunnel junction pattern and a bottom surface of the conductive line, and a third thickness of the top electrode is about 1.2 to 1.9 times the second thickness of the magnetic tunnel junction pattern.

10. A magnetic memory device, comprising:
an interconnection line on a substrate;
a contact, which is between the substrate and the interconnection line and connects the interconnection line to the substrate;
a conductive line on the interconnection line;
a magnetic tunnel junction pattern between the interconnection line and the conductive line;
a lower contact plug, which is between the magnetic tunnel junction pattern and the interconnection line;
a bottom electrode between the magnetic tunnel junction pattern and the lower contact plug; and
a top electrode between the magnetic tunnel junction pattern and the conductive line,
wherein the bottom electrode and the top electrode area spaced apart from each other in a first direction, and wherein a first thickness of the bottom electrode in the first direction is about 0.6 to 1.1 times a second thickness of the magnetic tunnel junction pattern in the first direction.

11. The magnetic memory device of claim 10, wherein the bottom electrode is in contact with a bottom surface of the magnetic tunnel junction pattern and a top surface of the lower contact plug, and wherein the bottom electrode extends beyond edges of the top surface of the lower contact plug.

12. The magnetic memory device of claim 10, wherein a third thickness of the top electrode in the first direction is about 1.2 to 1.9 times the second thickness of the magnetic tunnel junction pattern in the first direction.

13. The magnetic memory device of claim 12, wherein the top electrode is in contact with a top surface of the magnetic tunnel junction pattern and a bottom surface of the conductive line.

14. The magnetic memory device of claim 10, further comprising:
a selection element on the substrate,
wherein the interconnection line is electrically connected to one terminal of the selection element through the contact.

15. The magnetic memory device of claim 11, wherein each of the bottom and top electrodes is a monolithic layer of metal nitride, and wherein the top electrode contacts a bottom surface of the conductive line that extends beyond edges of the top electrode.

16. The magnetic memory device of claim 12, wherein the bottom and top electrodes comprise a same metal nitride.

17. A magnetic memory device, comprising:
an interconnection structure on a substrate, the interconnection structure comprising interconnection lines, which are spaced apart from each other in a first direction, and contacts, which are between the interconnection lines;
a lower contact plug, which is on the interconnection structure and contacts an uppermost one of the interconnection lines;
a magnetic tunnel junction pattern on the lower contact plug;
a bottom electrode between the lower contact plug and the magnetic tunnel junction pattern;
a conductive line on the magnetic tunnel junction pattern; and
a top electrode between the magnetic tunnel junction pattern and the conductive line, wherein the bottom electrode and the top electrode are spaced apart from each other in the first direction, and wherein a first thickness of the bottom electrode in the first direction is about 0.6 to 1.1 times a second thickness of the magnetic tunnel junction pattern in the first direction.

18. The magnetic memory device of claim 17, wherein the bottom electrode is a monolithic layer, which extends from a top surface of the lower contact plug to a bottom surface of the magnetic tunnel junction pattern.

19. The magnetic memory device of claim 17, wherein a third thickness of the top electrode in the first direction is about 1.2 to 1.9 times the second thickness of the magnetic tunnel junction pattern in the first direction.

20. The magnetic memory device of claim 19, wherein the top electrode is a monolithic layer, which extends from a top surface of the magnetic tunnel junction pattern to a bottom surface of the conductive line.

* * * * *